(12) United States Patent
Agnello et al.

(10) Patent No.: US 12,416,688 B2
(45) Date of Patent: Sep. 16, 2025

(54) METHOD TO ASSESS THE AGEING OF AN ELECTRICAL CONNECTION INSTALLED IN A VEHICLE

(71) Applicant: FERRARI S.P.A., Modena (IT)

(72) Inventors: Giuseppe Agnello, Modena (IT); Roberto Betro', Modena (IT); Giovanni Lo Calzo, Modena (IT); Ugo Sitta, Modena (IT); Luca Poggio, Modena (IT)

(73) Assignee: FERRARI S.P.A., Modena (IT)

( * ) Notice: Subject to any disclaimer, the term of this patent is extended or adjusted under 35 U.S.C. 154(b) by 127 days.

(21) Appl. No.: 18/511,536

(22) Filed: Nov. 16, 2023

(65) Prior Publication Data
US 2024/0175942 A1    May 30, 2024

(30) Foreign Application Priority Data
Nov. 25, 2022   (IT) .......................... 102022000024321

(51) Int. Cl.
*G01R 31/66*    (2020.01)
*G07C 5/08*    (2006.01)

(52) U.S. Cl.
CPC ........... *G01R 31/66* (2020.01); *G07C 5/0816* (2013.01)

(58) Field of Classification Search
None
See application file for complete search history.

(56) References Cited

U.S. PATENT DOCUMENTS

| | | | | |
|---|---|---|---|---|
| 4,929,903 A | * | 5/1990 | Saigo | G01R 31/52 324/544 |
| 5,323,117 A | * | 6/1994 | Endoh | G01R 31/1272 324/544 |

(Continued)

FOREIGN PATENT DOCUMENTS

CN    106202660 A    12/2016

OTHER PUBLICATIONS

Author: Sachan et al, Title: Cable Thermal Loss of Life due to Time Varying Load and Ambient Temperature: A Case Study, Publisher: International Conference on Condition Monitoring and Diagnosis, Published Date: Sep. 30, 2014, pp. 1-4 (Year: 2014).*

(Continued)

*Primary Examiner* — Muhammad Adnan
(74) *Attorney, Agent, or Firm* — CANTOR COLBURN LLP (57) ABSTRACT

The ageing of an electrical connection installed in a vehicle is evaluated by performing a series of samplings, spaced apart from one another at predefined time intervals, so as to determine a working temperature of the electrical connection for each sampling interval, and by determining a maximum duration of the electrical connection, assuming that the electrical connection was subjected, for its entire life, to the corresponding previously determined working temperature; then, an accumulated damage of the electrical connection is calculated, by overlapping a plurality of partial damage contributions, each of which is determined for each sampling interval, by dividing this sampling time interval by the corresponding maximum duration; finally, the accumulated damage is evaluated so as to identify any criticalities.

13 Claims, 4 Drawing Sheets

(56) References Cited

U.S. PATENT DOCUMENTS

| | | | |
|---|---|---|---|
| 6,518,772 B1* | 2/2003 | Milkovic | G01R 31/1272 |
| | | | 324/536 |
| 10,698,024 B1* | 6/2020 | Han | H01L 23/345 |
| 11,043,047 B2* | 6/2021 | Parfenov | G07C 5/0808 |
| 12,055,583 B2* | 8/2024 | Soulas | G01R 31/2874 |
| 2007/0085548 A1* | 4/2007 | Shinmoto | G01R 31/1272 |
| | | | 324/508 |
| 2017/0292983 A1* | 10/2017 | Wortberg | G01R 31/007 |
| 2018/0188310 A1* | 7/2018 | Koeppendoerfer | G01R 31/58 |
| 2021/0199560 A1* | 7/2021 | Ma | E01D 1/00 |
| 2021/0373065 A1* | 12/2021 | Takami | G01R 19/2509 |
| 2023/0028876 A1* | 1/2023 | Kita | G01R 31/08 |

OTHER PUBLICATIONS

Italian Search Report for Application No. 202200024321; Filing Date: Nov. 25, 2022; Date of Mailing: May 4, 2023; 8 pages.

Sachan et al., "Cable Thermal Loss of Life due to Time Varying Load and Ambient Temperature: A Case Study", International Conference on Condition Monitoring and Diagnosis, Sep. 30, 2014, pp. 1-4.

\* cited by examiner

METHOD TO ASSESS THE AGEING OF AN ELECTRICAL CONNECTION INSTALLED IN A VEHICLE

CROSS-REFERENCE TO RELATED APPLICATIONS

This patent application claims priority from Italian patent application no. 102022000024321 filed on Nov. 25, 2022, the entire disclosure of which is incorporated herein by reference.

TECHNICAL SECTOR

The present invention relates to a method to assess the ageing, and thus the residual life, of an electrical connection installed in a vehicle. In particular, the present invention refers to the of evaluation an electrical cable, to which the following discussion makes explicit reference without thereby losing generality.

PRIOR ART

As is known, in the electric traction vehicles (both in those purely electric and those hybrid where the electric traction is used in combination with a heat engine), the demand for the power size of the electrical/electronic components is constantly increasing, so that the levels of voltage and of intensity of current used in the electrical supply systems are increasing.

In the context of these demands or needs, the design of the electrical cables and their monitoring during use become of fundamental importance. In particular, the increase in the electrical powers used on the motor vehicles tends to lead to an increase in the working temperatures and therefore to greater thermal stresses on the insulating materials of the electrical cables. At the same time, as is known, the duration of the insulating materials is significantly influenced by the working temperatures: higher working temperatures correspond to a shorter duration of the insulator and thus of the cable.

Therefore, the need is felt to evaluate the thermal stresses the cables are subjected to during use, in real time, with a view to determining, for example, whether these thermal stresses lead to premature ageing of the insulating materials, compared to what is generally expected during the design steps, with a consequent need for interventions on the vehicles, with check and/or maintenance and/or replacement operations, with shorter times than those provided for by the usual periodic scheduled maintenance.

Aim of the invention is to satisfy the above needs, preferably in a simple and/or effective and/or economical way, so as to be able to intervene on the vehicle before the functionality of the insulating materials of the electrical cables is compromised.

SUMMARY OF THE INVENTION

The aforesaid aim is achieved by a method to assess the ageing of an electrical connection installed in a vehicle, as defined in claim 1.

The dependent claims define particular embodiments of the invention.

Thanks to the invention, starting from a characteristic life curve of the cable, directly during use of the vehicle it is possible to estimate the ageing of the electrical cable itself, that is, the damage accumulated progressively by the insulating material of the cable, whereby it is possible to estimate the remaining life time, thus facilitating any maintenance operations and avoiding the occurrence of malfunctions. In particular, this calculation methodology is applicable to any wiring on the vehicle.

BRIEF DESCRIPTION OF THE DRAWINGS

For a better understanding of the present invention, preferred embodiments will be described below by way of non-limiting example, with reference to the accompanying drawings, wherein.

DETAILED DESCRIPTION OF PREFERRED EMBODIMENTS OF THE INVENTION

Figure 1:
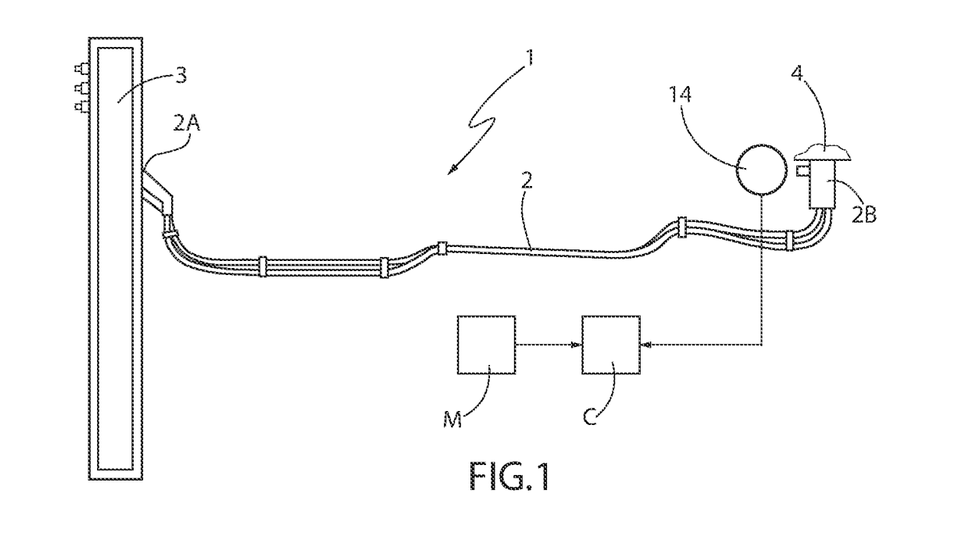
FIG. 1 is a diagram partially representing a vehicle electrical system, having an electrical cable whose ageing is evaluated according to a preferred embodiment of the method of the present invention.
Figure 2:
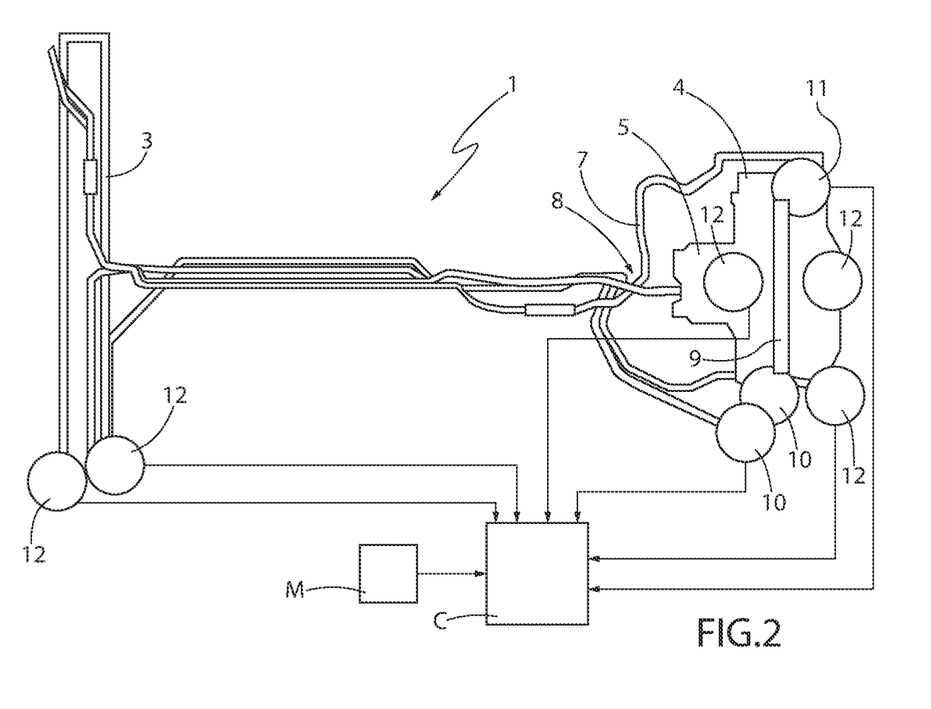
FIG. 2 is analogous to FIG. 1 and schematically shows a cooling system for cooling at least one electrical/electronic component of the electrical system of FIG. 1.

In FIG. 1, the reference numeral 1 denotes, as a whole, an electrical system (schematically and partially shown) which is installed in a vehicle, for example in a car, and comprises at least one electrical cable 2. In the specific case, the cable 2 has two ends 2A and 2B that are opposite to each other and are electrically connected to a high-voltage battery 3 and respectively to an inverter 4. As also shown in FIG. 2, the inverter 4 is in turn connected to at least an electric motor 5, which is associated with an axle (not shown) of the vehicle, is controlled to drive at least one wheel of said axle and, for example, is arranged near the inverter 4.

According to the method of the present invention, it is possible to estimate the ageing, or the accumulated damage, of the insulating material that wraps the conductive core of the cable 2, starting from the working temperatures that thermally stress said insulating material and that vary as the time elapses.

For each instant or interval of time, the working temperature of the cable can be determined as the sum of two contributions due respectively to:

an ambient temperature value, corresponding to the temperature of the surrounding environment around the electrical cable 2, and an over-temperature value, caused by the current flowing in the electrical cable 2.

As regards the ambient temperature, reference is made, for sake of simplicity, to the temperature of the electrical/electronic components installed on the vehicle near the cable 2.

In the specific case, these electrical/electronic components are defined by the battery 3 and/or by the inverter 4 and/or by the motor 5, and are generally cooled by an exchange heat fluid which flows in the ducts 7 of a cooling system 8 (partially shown). The cooling system 8 comprises a heat exchanger 9 mounted on, or integrated into, the electrical/electronic component to be cooled, and temperature sensors 10 and 11 (schematically shown), configured so as to detect the temperature of the exchange heat fluid at least at an inlet and at least at an outlet of the heat exchanger 9. In the specific case shown, the heat exchanger 9 cools the inverter 4 and has two inlets and a single outlet, hence it comprises a sensor 10 for each of these inlets and a sensor 11 for this outlet.

By knowing the flow rate of exchange heat fluid in/out through the heat exchanger 9 and by detecting the temperature by means of the sensors 10 and 11, it is possible to calculate the amount of heat exchanged at the heat exchanger 9 and thus to calculate a temperature value indicative of the temperature of the electrical/electronic component being cooled, through heat exchange equations or similar relations, known to the person skilled in the art and stored in a memory M present on the vehicle (schematically shown).

The temperature of the electrical/electronic component is variable as a function of the time and is therefore monitored by the detections of the sensors 10 and 11. In this case, said temperature is indirectly determined, i.e. it is a value calculated or estimated starting from the detections of the sensors 10 and 11.

In combination or as an alternative to the sensors 10 and 11, the temperature of the electrical/electronic components (battery 3 and/or inverter 4 and/or motor 5) can be directly detected by means of temperature sensors 12, coupled inside and/or on an external surface of the same electrical/electronic component, or arranged in a position facing and close to said external surface. In the specific case, the battery 3 is provided with two temperature sensors 12, while the inverter 4 and the motor 5 are provided altogether with three temperature sensors 12.

As an alternative to the use of temperature sensors, the temperature of the electrical/electronic components can be estimated starting from the operating conditions of the vehicle (e.g. in response to profiles and/or values of speed of the motor 5, and/or in response to profiles and/or values of acceleration of the motor 5, and/or in response to torque requests and/or power requests set by the driver), starting from relations that are stored in the memory M and link the temperature of the electrical/electronic components to a plurality of predefined operating conditions. These relations can be defined, for example, by mathematical functions, tables, graphs, etc., and can be obtained through appropriate experimental tests, on the bench and/or on the road, or through appropriate simulations via software, in response to standard type vehicle mission profiles, to be subsequently stored in the memory M.

Alternatively, the temperature of the electronic electrical components can be estimated based on the intensity of current passing through them and/or on the electrical power engaged instant by instant, i.e. based on electrical quantities determined based on detections of appropriate sensors (not shown). This estimation can be performed starting from relations that are stored in the memory M and that link the temperature to the intensity of current and/or to the electrical power engaged. Similar to the previous option, these relations can be defined by mathematical functions, tables, graphs, etc. . . . , and can be obtained through appropriate experimental tests, on the bench and/or on the road, or through appropriate simulations via software, before being stored on the vehicle.

Once the temperature of the electrical/electronic components has been determined (as estimation/calculation, and/or as direct detection of temperature), it is possible to estimate an ambient temperature around the electrical cable 2, as time elapses.

For this purpose, in particular, it is assumed that the ends of the electrical cables are at the same temperature as the electrical/electronic components to which they are connected. In the specific case under examination, concerning the electrical cable 2, it is assumed that the ambient temperature around the end 2A corresponds to the temperature of the battery 3 and that the ambient temperature around the end 2B corresponds to the temperature of the inverter 4 (FIG. 1).

At this point, the ambient temperature around the electric cable 2 can be determined starting from the ambient temperatures concerning the ends thereof 2A and 2B. For example, it can be assumed that the ambient temperature around the electric cable 2 at a given instant of time is an interpolation, for example is the mathematical average, of the ambient temperatures concerning the ends thereof 2A and 2B. As an alternative to an interpolation, it can be assumed that it corresponds to the maximum value between the ambient temperatures at the two ends 2A and 2B. The person skilled in the art will be able to choose these or other techniques to determine the ambient temperature around the electric cable 2, starting from those of the electric/electronic components arranged around, on the basis of specific needs, for example on the basis of the position of the electric cable 2 on the vehicle and/or on the basis of the detected intensities of current.

As an alternative to these estimation operations, it is possible to provide temperature sensors that are arranged directly on the electrical cable 2, or near the latter, so as to detect the temperature of the environment around the cable 2 directly, i.e. without considering the temperature of the electrical/electronic components to which the cable itself is connected. However, this solution involves a higher cost and complexity, as it requires additional sensors, while the above options for estimating the ambient temperature around the cable take sensors into consideration that are already normally mounted on the vehicles to perform other functions.

Figure 4:
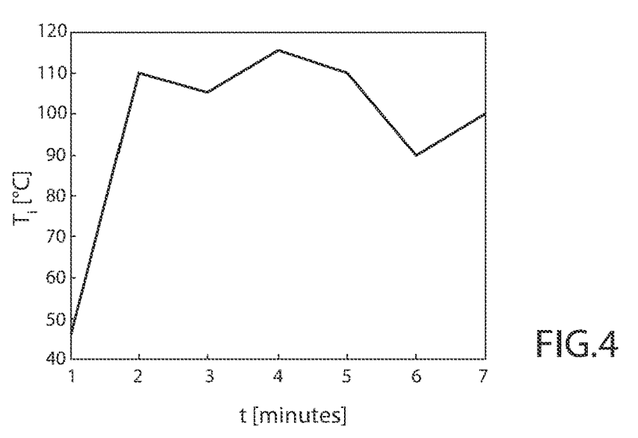
FIG. 4 is a graph showing the trend of the ambient temperature of the surrounding environment around the electrical cable of FIG. 1.

FIG. 4 shows a graph with a typical trend of the ambient temperature around the electric cable 2 as the time t elapses.

Figure 3:
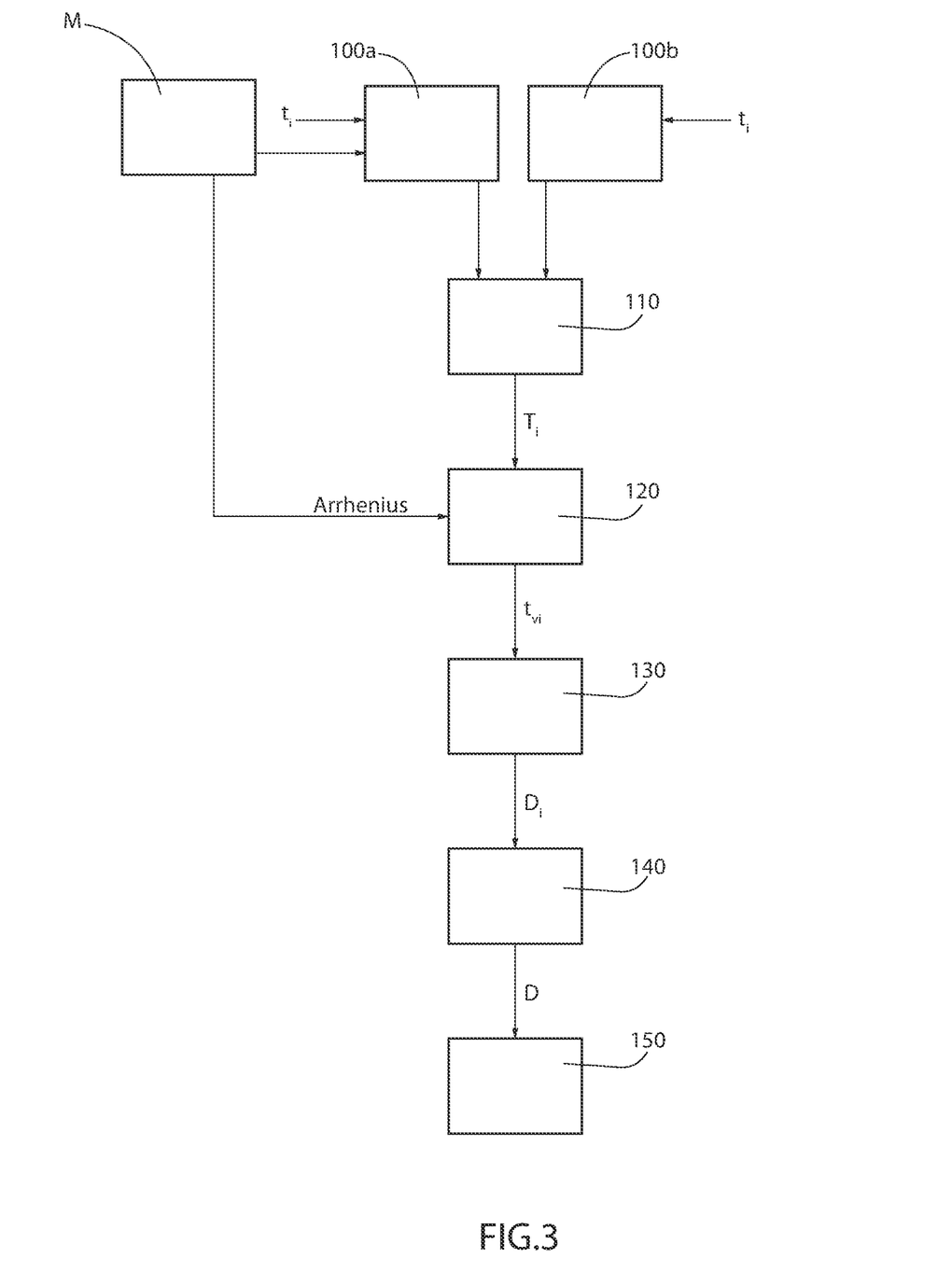
FIG. 3 is a block diagram schematically showing the steps of a preferred embodiment of the method of the present invention.

With reference to the block diagram of FIG. 3, the sampling performed by the sensors mounted on the vehicle, and the consequent operations to determine the ambient temperature, as a whole, are represented by block 100a.

Figure 5:
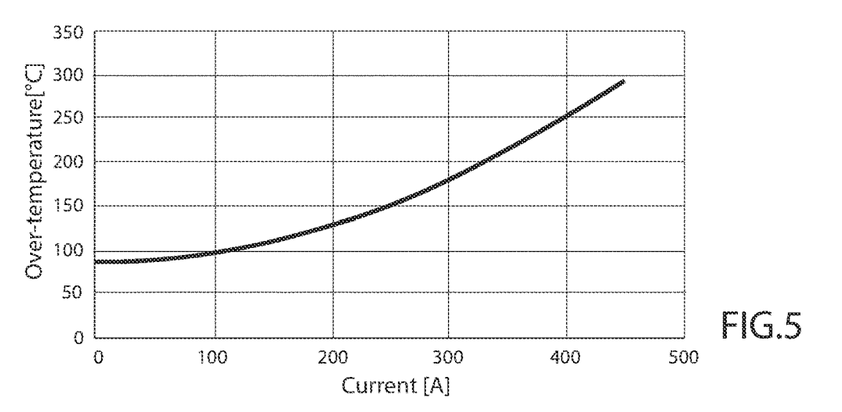
FIG. 5 is a curve that relates the intensity of current flowing in the electrical cable to an over-temperature caused by this current.

On the other hand, the sampling operations and the operations to determine the over-temperatures due to the electric current flowing in the cable 2 are represented as a whole by block 100b. In particular, to perform these operations, the over-temperature is determined starting from the intensity of the current flowing in the cable 2, detected through a current sensor 14 (schematically shown in FIG. 1), and by at least a stored relation that links the intensity of current to the over-temperature itself. This is a relation that is generally provided directly by the manufacturer of the electrical cable. FIG. 5 shows an example thereof in the form of a graph, but it is a relation that could also be provided in the form of a table, mathematical formula (optionally approximated), or in another way.

In practice, the intensity of current detected along the axis of the abscissae is introduced in the graph of FIG. 5, and the corresponding over-temperature is obtained along the axis of the ordinates.

The ambient temperature and over-temperature values are determined on the basis of detections sampled at predefined time intervals, which are preferably regular, equal to each other.

In the discussion that follows, the value of the time intervals between two consecutive samplings is indicated by reference ti, and the corresponding value of the working temperature of the electric cable 2 is indicated by reference Ti. Preferably, the sampling time interval ti is the same for all the detected quantities involved, indicated above. In FIG. 4, for example, the sampling interval ti is equal to one minute.

For simplicity's sake, it is assumed that, in the space of each of these time intervals ti, the surrounding ambient temperature and the over-temperature due to the flowing current remain respectively constant.

In FIG. 3, block 110 represents the sum of the two values obtained in blocks 100a and 100b for each time interval ti, in order to obtain the corresponding working temperature Ti, which consequently is also considered constant in that time interval ti.

The ageing, or accumulated damage, of the insulating material of the cable is indicated by reference D and is calculated as a combination or overlap of a series of portions or partial contributions (block 140 in FIG. 3); each of these partial contributions is indicated by reference Di and is caused by the working temperature Ti determined in the corresponding sampling interval. In other words, each sampling interval is considered as if it were a thermal stress cycle, at the working temperature (which has been determined at block 110), on the insulating material of the cable, in succession with respect to the other thermal stress cycles; and each thermal stress cycle causes a partial damage and thus a reduction of the overall maximum duration (i.e. an ageing) of the cable.

In particular, in order to overlap or combine the various partial contributions Di, the cumulative damage theory is used, which states that the total accumulated damage consists of the sum of the partial contributions, i.e. it is considered equal to the sum of the damages caused by the individual thermal stress cycles (each caused by a respective working temperature Ti in the time interval ti).

Therefore:

$$D = \Sigma Di$$

The total accumulated damage D and the partial contributions Di can advantageously be expressed in percentage terms with respect to the maximum overall duration, i.e. to the life cycle, of the electric cable. For example, an accumulated damage D equal to 50%, after a certain period of use of the vehicle, corresponds to having reached the middle of the life cycle of the electric cable.

For an electrical insulating material, as is known, the maximum duration, i.e. the life cycle, essentially depends on the working temperature said insulating material is subjected to during use.

Figure 6A:
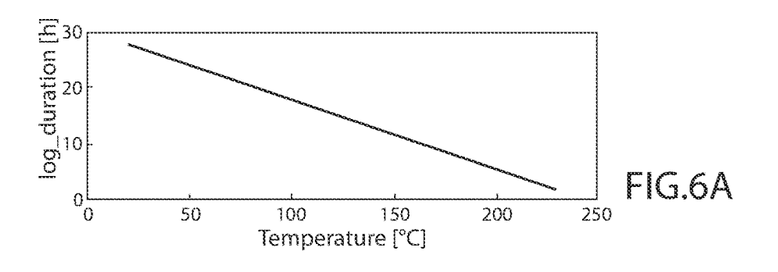
FIGS. 6A and 6B are life curves of an insulating material of the electrical cable, i.e. curves that relate the maximum total duration of the insulating material to the working temperature of the electrical cable.
Figure 6B:
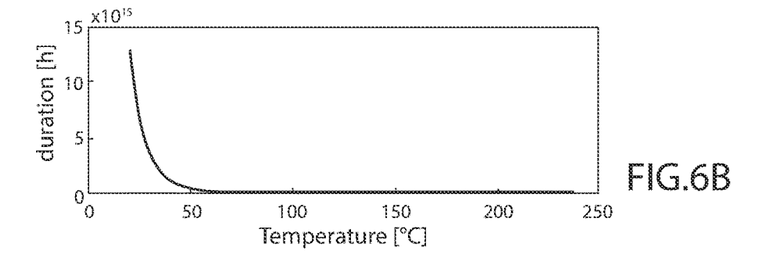
Figure 7:
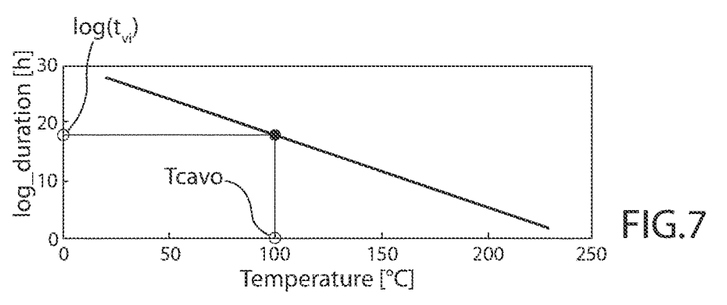
FIG. 7 is analogous to FIG. 6A and shows a step of the method of the present invention.

In this regard, FIGS. 6A and 6B show respective graphs expressing the maximum duration of an electrical insulator as a function of the temperature, according to Arrhenius equation. The two graphs are equivalent: in FIG. 6A the duration values along the axis of the ordinates are expressed on a logarithmic scale, while in FIG. 6B they are expressed on a linear scale. The meaning of these graphs is as follows, with reference to FIG. 7: starting, along the axis of the abscissae, from the working temperature of the cable (Tcable), thanks to the graph, it is obtained, along the axis of the ordinates, the maximum duration tvi (or its logarithm) that the insulator of the cable would have if it were subjected for its entire life to this temperature (Tcable).

Such a graph (or a similar relation, which may optionally be established on the basis of other theories of study of the insulating materials) is generally referred to as the "life curve" of the insulating material, and is provided directly by the manufacturer of the electrical cable, for example on the basis of the insulation class of its insulating material.

Such a graph or relation is available in the memory M of the vehicle and is applied to block 120 in FIG. 3, using the working temperature Ti that has been previously obtained at block 110, for each sampling interval (i.e., Tcable=Ti).

Thereafter, the result defined by the maximum duration tvi, obtained for each sampling interval, is used to determine each partial contribution Di of the accumulated damage (block 130). In fact, in analogy to each partial contribution Di of the Miner's Rule, accumulated damage, in percentage terms, is considered as the ratio of the time interval (ti) elapsed at a given temperature (Tcable=Ti) and the maximum total duration (tvi) that the insulator would have if it were subjected to the same temperature for its entire life.

In the case of the samplings described above, therefore, we have:

$$Di = ti/tvi$$

from which one obtains $$D = \Sigma(ti/tvi)$$

The value of accumulated damage D that has thus been calculated in percentage terms in block 140 represents the ageing with respect to the overall life cycle, and thus provides indications on the residual life time of the insulator; not only that, it can also provide indications on the health status of the insulator. Therefore, the accumulated damage D is used, in general terms, to perform an evaluation (block 150, in FIG. 3), on the residual life time and/or on the state of health, and therefore to determine the need for any interventions or checks on the cable.

Figure 8:
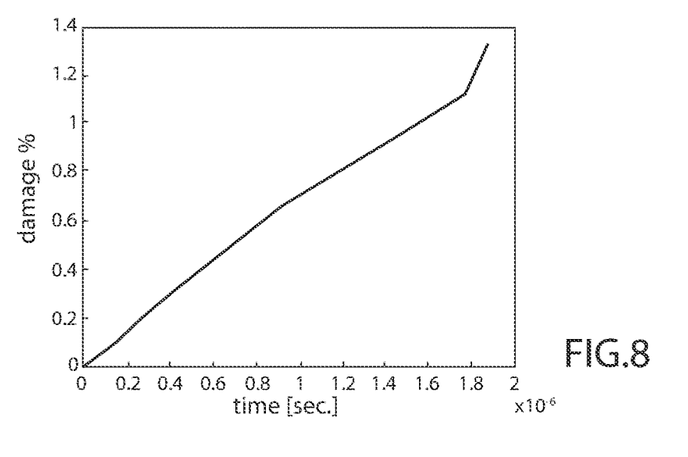
FIG. 8 is a graph showing the ageing, i.e. the accumulated damage, of the electrical cable as a function of the time, determined according to the method of the present invention.

For example, it is possible to construct a curve concerning the accumulated damage D during the running of the vehicle, i.e. as a function of the travel time, as shown in FIG. 8.

Figure 9:
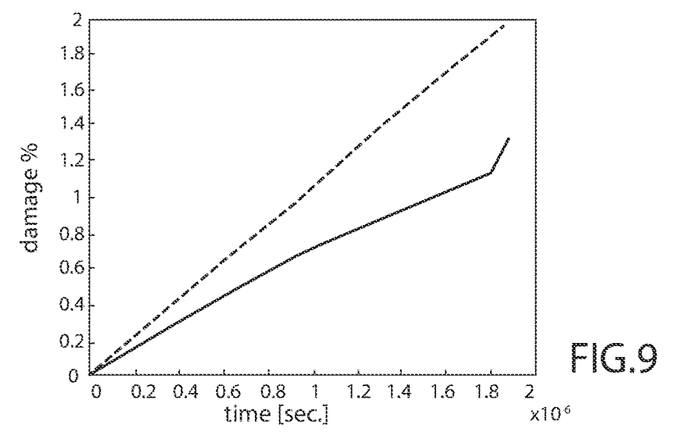
FIG. 9 is analogous to FIG. 8 and shows the accumulated damage in relation to a reference curve.

This curve (i.e. each value of the accumulated damage D) is compared with a reference in order to establish the presence of any criticalities as the time elapses, and therefore, to emit a corresponding signal, for example a control signal for a data processing unit or an alarm signal for the driver. In the specific case shown in FIG. 9, this reference is defined by a damage accumulation curve expected, which has been determined in the initial step of design and setting of the vehicle, for example through appropriate simulations. In particular, such simulations can take into account, as input, the intensities of current concerning mission profiles of the vehicle, which significantly represent a standard life cycle of the same vehicle.

For example, by comparing the damage accumulation curve expected with the one of FIG. 8 which has been calculated in real time, an alarm signal is generated if the second curve exceeds the first one (optionally with a predefined deviation margin). This exceedance, in fact, is indicative of the fact that the cable has been subjected to thermal stresses greater than those provided for by the project, therefore it is appropriate a direct check of the cable.

In combination or as an alternative to the emission of an alarm signal, in block 150 of FIG. 3 the evaluation of the accumulated damage D can be performed in order to recalibrate the reference, i.e. the damage accumulation curve expected, or to predict when the cable will reach the end of its life cycle and therefore to establish when it will be necessary to intervene with a replacement of the cable. This calculation, for example, can also be used to regulate the expected missing time for the scheduled maintenances of the vehicle.

In conclusion, summarizing what has been exposed above, the method of the present invention is performed through an appropriate software installed in a processing unit C (FIGS. 1 and 2) provided on the vehicle and includes the following steps:

performing a series of samplings in order to determine, for each sampling interval ti, a contribution due to the surrounding environmental temperature around the cable (block 100a), and a contribution due to the over-temperature caused by the flowing electric current (block 100b), adding the two temperature contributions, for each sampling interval ti, so as to determine the working temperature at which the cable is stressed (block 110);

determining the maximum duration tvi of the cable (block 120) if the latter were subjected, for its entire life, to the working temperature Ti that has been determined at block 110, establishing a partial contribution Di of the accumulated damage in the sampling interval (block 130), by dividing the time interval (ti) by the maximum duration (tvi) previously determined at block 120, overlapping the various partial contributions (block 140) so as to obtain a total accumulated damage D, and evaluating the latter, for example in order to establish any criticalities.

Thanks to the method of the present invention, it is therefore possible to establish whether the cable 2 meets the design expectations, and/or whether the cable 2 is approaching the end of its life cycle dangerously, or, simply, whether it is appropriate to inspect the cable 2. It is then evident that the method of the present invention is performed in real time, i.e. directly during the use of the vehicle, and automatically, i.e. without the need for interventions by the driver.

Furthermore, the data concerning the accumulated damage D and/or its evaluation may optionally be transmitted to a remote operating station, which collects such data, for example for after-sales checks and/or for statistical analyses, for example to set up different strategies for the design of the cables (for example, choice of any thermal protections and decision of the cable class).

From the foregoing it appears, then, that the method of the present invention is relatively simple and does not require significant computational resources.

Finally, it is clear that modifications and variants can be made to the method according to the present invention which, however, do not fall outside the scope of protection as defined by the appended claims.

In particular, the method of the present invention is applicable to all the electrical connections in the electrical system 1 of the vehicle, whether they are high or low voltage ones.

The invention claimed is:

1. A method to assess the ageing of an electrical connection (2) installed in a vehicle; the method comprising the steps of:

carrying out a series of samplings (100a, 100b), spaced apart from one another at predefined time intervals, so as to determine (110) a working temperature (Ti) said electrical connection (2) s subjected to for each sampling interval, determining (120) a maximum duration (tvi) of the electrical connection (2) for each sampling interval, assuming that said electrical connection (2) was subjected, for its entire life, to the corresponding working temperature (Ti) that has been previously determined, calculating (130) a partial damage contribution (Di) for each sampling interval, by dividing the corresponding time interval (ti) by the corresponding maximum duration (tvi) that has been previously determined, calculating (140) an accumulated damage (D) of the electrical connection (2), by overlapping the partial damage contributions (Di) that have been calculated;

evaluating the accumulated damage (D) that has been calculated;

wherein the accumulated damage (D) is calculated in real time and is evaluated in comparison with a reference, in order to establish the presence of any criticalities as the time elapses and emit a corresponding signal.

2. The method according to claim 1, wherein the working temperature (Ti) is determined, for each sampling interval, by adding a contribution due to a surrounding ambient temperature value, around said electrical connection (2), and a contribution due to an over-temperature value, caused by an electric current flowing in said electrical connection (2).

3. The method according to claim 2, wherein the ambient temperature value is determined on the basis of at least a temperature of electrical/electronic components (3, 4, 5) arranged near said electrical connection (2).

4. The method according to claim 3, wherein the temperature of the electrical/electronic components (3,4,5) is directly detected, or it is indirectly detected by detecting a temperature of an exchange heat fluid which flows in a cooling system designed to cool said electrical/electronic components (3,4,5).

5. The method according to claim 3, wherein said electrical connection (2) is defined by an electrical cable having two opposite ends (2a, 2b) which are connected to said electrical/electronic components, and wherein the ambient temperature value is calculated on the basis of two temperature values, respectively indicative of temperatures of the two said ends (2a, 2b).

6. The method according to claim 2, wherein the ambient temperature value for each sampling interval is determined by a direct detection of temperature on said electrical connection.

7. The method according to claim 2, wherein the over-temperature value is determined by detecting an intensity of current flowing in said electrical connection, and on the basis of a stored first predefined relation which links the over-temperature to the intensity of current.

8. The method according to claim 1, wherein the maximum duration (tvi) of the electrical connection (2) is determined for each sampling interval by a stored second predefined relation, concerning the maximum duration of an insulating material which defines part of said electrical connection.

9. The method according to claim 8, wherein said second predefined relation corresponds to the maximum duration of the insulating material according to Arrhenius equation.

10. The method according to claim 1, wherein the accumulated damage (D) is calculated as the sum of said partial damage contributions (Di).

11. The method according to claim 1, wherein said reference is defined by a predefined curve concerning an expected accumulated damage.

12. The method according to claim 11, wherein an alarm signal is emitted if the accumulated damage exceeds the expected one.

13. The method according to claim 1, wherein the accumulated damage (D) is evaluated so as to estimate a residual life of said electrical connection.

* * * * *